United States Patent
Kim

(10) Patent No.: US 7,892,912 B2
(45) Date of Patent: Feb. 22, 2011

(54) METHOD FOR FORMING VERTICAL CHANNEL TRANSISTOR OF SEMICONDUCTOR DEVICE

(75) Inventor: Myung-Ok Kim, Icheon-si (KR)

(73) Assignee: Hynix Semiconductor Inc., Icheon-Si, Gyeonggi-Do (KR)

( * ) Notice: Subject to any disclaimer, the term of this patent is extended or adjusted under 35 U.S.C. 154(b) by 0 days.

(21) Appl. No.: 12/318,177

(22) Filed: Dec. 23, 2008

(65) Prior Publication Data
US 2009/0317954 A1 Dec. 24, 2009

(30) Foreign Application Priority Data
May 21, 2008 (KR) ............... 10-2008-0047083

(51) Int. Cl.
*H01L 21/28* (2006.01)
*H01L 21/8234* (2006.01)

(52) U.S. Cl. ............... 438/212; 438/268; 438/589; 257/330; 257/331; 257/E21.41; 257/E21.629; 257/E29.264

(58) Field of Classification Search ............... 438/212, 438/268, 589; 257/329, 330, 331, 332, E21.41, 257/E29.262, E29.264, E21.629
See application file for complete search history.

(56) References Cited

U.S. PATENT DOCUMENTS

| | | | | |
|---|---|---|---|---|
| 4,626,492 A * | 12/1986 | Eilbeck | ............... | 430/191 |
| 6,150,210 A * | 11/2000 | Arnold | ............... | 438/243 |
| 6,265,274 B1 | 7/2001 | Huang et al. | | |
| 6,414,356 B1 * | 7/2002 | Forbes et al. | ............... | 257/350 |
| 6,531,350 B2 * | 3/2003 | Satoh et al. | ............... | 438/197 |
| 6,537,870 B1 * | 3/2003 | Shen | ............... | 438/243 |
| 6,544,833 B2 * | 4/2003 | Kawakubo | ............... | 438/239 |
| 6,580,124 B1 * | 6/2003 | Cleeves et al. | ............... | 257/331 |
| 6,818,946 B1 * | 11/2004 | Venkatraman | ............... | 257/330 |
| 6,853,023 B2 * | 2/2005 | Goebel et al. | ............... | 257/301 |
| 6,864,532 B2 * | 3/2005 | Aoki et al. | ............... | 257/330 |
| 7,071,048 B2 * | 7/2006 | Son et al. | ............... | 438/206 |

(Continued)

FOREIGN PATENT DOCUMENTS

KR 2003-050434 * 6/2003

(Continued)

OTHER PUBLICATIONS

Translation of Korean Office Action for Korean application No. 10-2008-0047083, that was previously filed on Feb. 12, 2010.

(Continued)

*Primary Examiner*—Mary Wilczewski
(74) *Attorney, Agent, or Firm*—Lowe Hauptman Ham & Berner LLP

(57) ABSTRACT

A method for forming a vertical channel transistor of a semiconductor device includes forming a plurality of pillar patterns over a substrate, forming a gate insulation layer encapsulating the resultant pillar pattern structure, forming a surrounding gate electrode conduction layer surrounding the sidewalls of the pillar pattern including the gate insulation layer, filling a sacrificial layer to a predetermined height of a surrounding gate electrode in a gap region between neighboring pillar patterns having the surrounding gate electrode conduction layer, and forming the surrounding gate electrode by removing a portion of the surrounding gate electrode conduction layer exposed by the sacrificial layer.

17 Claims, 5 Drawing Sheets

U.S. PATENT DOCUMENTS

| | | | |
|---|---|---|---|
| 7,098,502 B2 * | 8/2006 | Mathew et al. | 257/308 |
| 7,205,608 B2 * | 4/2007 | Chindalore et al. | 257/330 |
| 7,371,645 B2 * | 5/2008 | Muemmler et al. | 438/270 |
| 7,531,412 B2 * | 5/2009 | Yoon et al. | 438/270 |
| 2003/0124804 A1 * | 7/2003 | Soo | 438/268 |
| 2004/0041189 A1 * | 3/2004 | Voshell et al. | 257/297 |
| 2004/0121540 A1 * | 6/2004 | Lin | 438/257 |
| 2005/0019993 A1 * | 1/2005 | Lee et al. | 438/157 |
| 2005/0037576 A1 * | 2/2005 | Chen et al. | 438/259 |
| 2006/0068531 A1 * | 3/2006 | Breitwisch et al. | 438/149 |
| 2007/0145464 A1 * | 6/2007 | Voshell et al. | 257/314 |
| 2009/0004797 A1 * | 1/2009 | Lee | 438/270 |
| 2009/0148992 A1 * | 6/2009 | Oyu | 438/268 |

FOREIGN PATENT DOCUMENTS

| | | |
|---|---|---|
| KR | 10-0506336 | 7/2005 |
| KR | 10-2006-0000401 | 6/2006 |
| KR | 10-0618875 | 8/2006 |
| KR | 1020070047069 | 5/2007 |
| KR | 10-0752674 | 8/2007 |
| KR | 10-2008-0022380 | 11/2008 |

OTHER PUBLICATIONS

Korean Notice of Allowance for 10-2008-0047083.

* cited by examiner

METHOD FOR FORMING VERTICAL CHANNEL TRANSISTOR OF SEMICONDUCTOR DEVICE

CROSS-REFERENCE TO RELATED APPLICATIONS

The present application claims priority of Korean patent application number 10-2008-0047083, filed on May 21, 2008, which is incorporated herein by reference in its entirety.

BACKGROUND

The disclosure relates to a method for fabricating a vertical channel transistor in a semiconductor device, and more particularly, to a method for forming a surrounding gate electrode of a vertical channel transistor in a semiconductor device.

As semiconductor devices become more highly integrated, the dimensions of the cells integrated on a wafer begin to decrease. This decrease in the cell dimensions can cause to a decrease in the channel length of a planar-type transistor, thus, a shorting effect, such as a Drain Induced Barrier Lowering (DIBL), a hot carrier effect or a punch-through effect, may occur.

The transistor in a giga-bit DRAM device requires at least an area of $4F^2$, where F is minimum feature size, thus, a reduction in cell dimensions and cell area upon integration will be unavoidable. Therefore, a means to maintain the transistor channel length while increasing the degree of integration in the DRAM device is necessary. In order to overcome the limitations on integrating planar-type transistors, conventional art suggests using vertical channel transistors.

FIG. 1 displays a cross-sectional view illustrating a conventional method for forming a vertical channel transistor in a semiconductor device.

As shown in FIG. 1, a substrate 100 is etched to a first predetermined depth Du using a hard mask pattern 120 as an etch barrier to form an upper pillar pattern 110A. A pad oxide layer 130 may be interposed between the hard mask pattern 120 and the upper pillar pattern 110A.

A spacer (not shown) is formed on the sidewalls of the upper pillar pattern 110A and the hard mask pattern 120, and a lower pillar pattern 110B is formed by etching the substrate 100 to a certain depth $D_L$ lower than the first predetermined depth $D_U$ using the hard mask pattern 120 and the spacer as etch barriers. Herein, the lower pillar pattern 110B and the upper pillar pattern 110A are connected to each other forming a single-body structure.

Isotropic etching of the substrate 100 is performed, forming the lower pillar pattern 110B with a recessed, predetermined width W1, narrower than the predetermined width of the upper pillar pattern W2. A gate insulation layer 140 is then deposited encapsulating the resultant pillar pattern structure. A surrounding gate electrode conduction layer is deposited surrounding the pillar patterns and the gate insulation layer 140, and spacer etching of the surrounding gate electrode conduction layer is performed to form the a surrounding gate electrode 150 surrounding the lower pillar pattern 110B.

As described above, a first width W1 of the lower pillar pattern 110B is smaller than and supports a second width W2 of the upper pillar pattern 110A, thus, forming an unstable structure. As a result, the pillar patterns 110 lean or collapse, restricting the possible degree of integration in accordance with the conventional method for forming the vertical channel transistor. Therefore, it is impossible to implement the conventional vertical channel transistor in semiconductor devices having narrow line widths of approximately 30 nm or less.

The hard mask pattern 120 on the pillar pattern 110 serves an etch barrier during several process steps of the fabrication, i.e. a pillar pattern formation process, a planarization process, and a damascene word line formation process. During the surrounding gate electrode formation process, a large portion of the hard mask pattern 120 may be damaged when etching the surrounding gate electrode conduction layer. Therefore, the hard mask pattern 120 cannot serve as a suitable etch barrier in subsequent processes, e.g., the damascene word line formation process, without exposing and putting at risk for damage the pillar patterns 110 located below the hard mask pattern 120.

In addition, at the etching process of the surrounding gate electrode conduction layer deposited encapsulating the sidewalls of the upper pillar pattern 110A, the gate insulation layer 140 formed on bottom of a gap region between the neighboring pillar patterns 110 can be exposed and damaged. Thus, the substrate 100 can also become damaged.

FIG. 2 displays a conventional vertical channel transistor under a Scanning Electron Microscope (SEM).

As shown in FIG. 2, since the lower pillar pattern has a smaller width than the upper pillar pattern, the pillar pattern can lean or collapse during the formation process of the vertical channel transistor. Therefore, when the vertical channel transistor is formed according to the conventional art, there is a limitation in improving the degree of integration in the semiconductor devices.

SUMMARY

In accordance with one or more embodiments, a method for forming a vertical channel transistor of a semiconductor device includes forming a surrounding gate electrode at sidewalls of bar-type pillar patterns.

In accordance with one or more embodiments, a method for forming a vertical channel transistor of a semiconductor device completely filling a gap region between the neighboring pillar patterns with a Spin On Carbon (SOC) sacrificial layer to a predetermined depth of the surrounding gate electrode, and etches a surrounding gate electrode conduction layer.

In accordance with one or more embodiments, there is provided a method for forming a vertical channel transistor of a semiconductor device includes: forming a plurality of pillar patterns above a substrate; forming a gate insulation layer encapsulating the resultant pillar pattern structure; forming a surrounding gate electrode conduction layer surrounding the sidewalls of the pillar patterns including the gate insulation layer; filling a sacrificial layer to a predetermined height of a surrounding gate electrode in a gap region between neighboring pillar patterns having the surrounding gate electrode conduction layer; and forming the surrounding gate electrode by removing a portion of the surrounding gate electrode conduction layer exposed by the sacrificial layer.

DESCRIPTION OF SPECIFIC EMBODIMENTS

Figure 1:
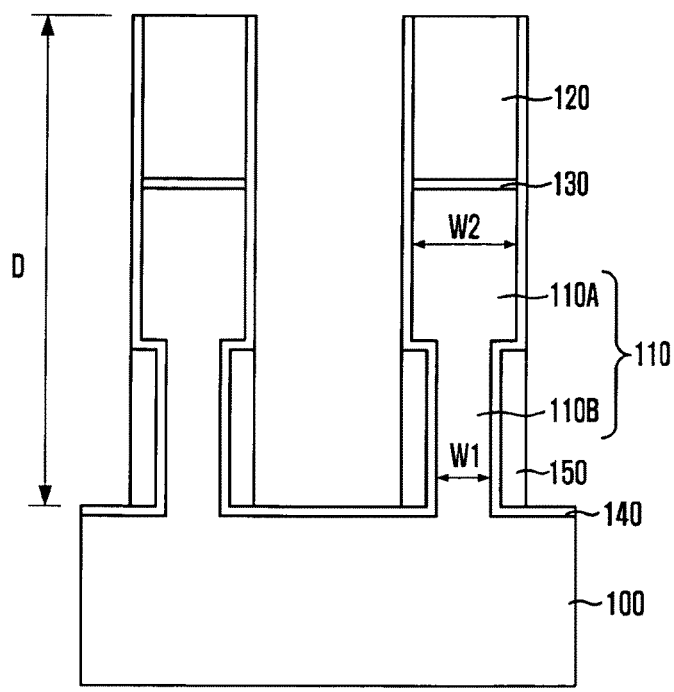
FIG. 1 is a cross-sectional view illustrating a conventional method for forming a vertical channel transistor of a semiconductor device.

Hereinafter, a method for forming a vertical channel transistor of a semiconductor device in accordance with some embodiments will be described in detail with reference to the accompanying drawings.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or the substrate. Furthermore, the same or like reference numerals throughout the various embodiments represent the same or like elements in different drawings.

FIGS. 3A to 3E are cross-sectional views illustrating a method for forming a vertical channel transistor in accordance with an embodiment.

Figure 3A:
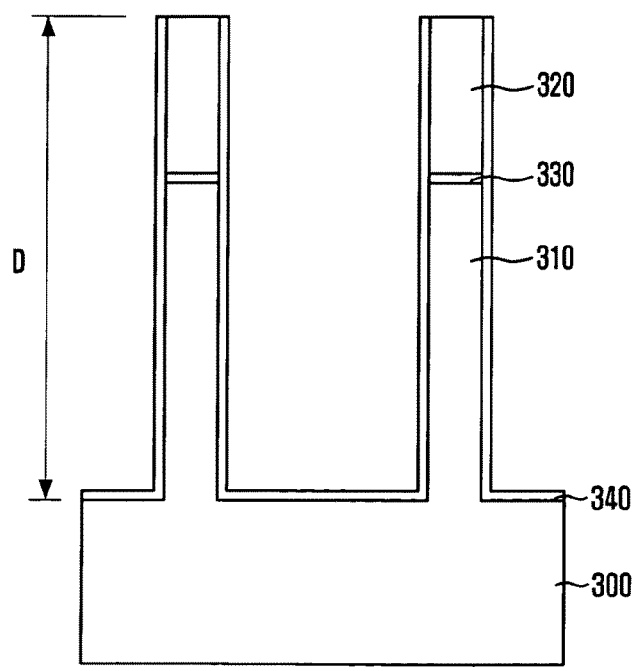
FIGS. 3A to 3E are cross-sectional views illustrating a method for forming a vertical channel transistor in accordance with embodiment.
Figure 2:
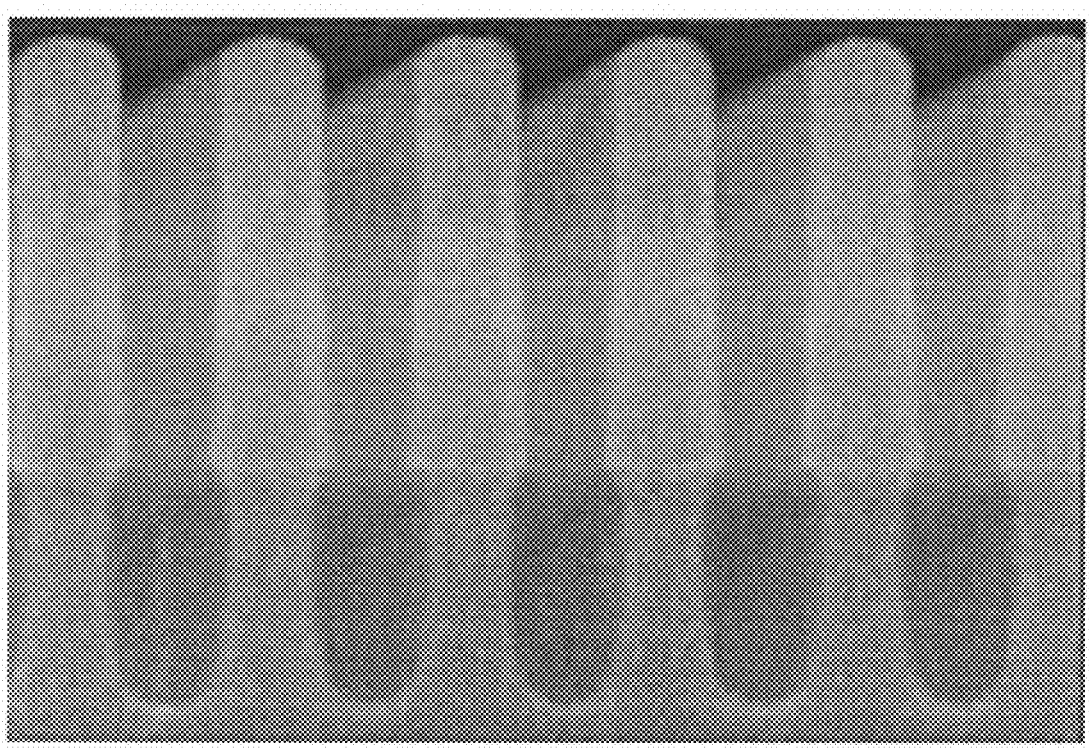
FIG. 2 is a Scanning Electron Microscopic (SEM) picture showing a conventional vertical channel transistor.

As shown in FIG. 3A, island-type hard mask patterns 320 are formed above a substrate 300, and a bar-type pillar pattern 310 is formed by etching the substrate 300 to a certain depth D using the hard mask patterns 320 as etch barriers.

The pillar pattern 310 has a substantially uniform width from the upper region to the lower region, i.e. a width differing by less than 20 nm. Also, etching depth ranges from approximately 1500 Å to approximately 2500 Å.

The hard mask patterns 320 may be formed of an oxide layer, a nitride layer or a stack structure including a lower nitride layer and an upper oxide layer. Also, a pad oxide layer 330 may be interposed between the hard mask patterns 320 and the pillar patterns 310.

A gate insulation layer 340 is formed encapsulating the resultant pillar pattern structure. The gate insulation layer 340 may be formed of a material selected from a group consisting of $SiO_2$, TiN, TaN, TaCN and a material having a high dielectric constant (k).

Figure 3B:
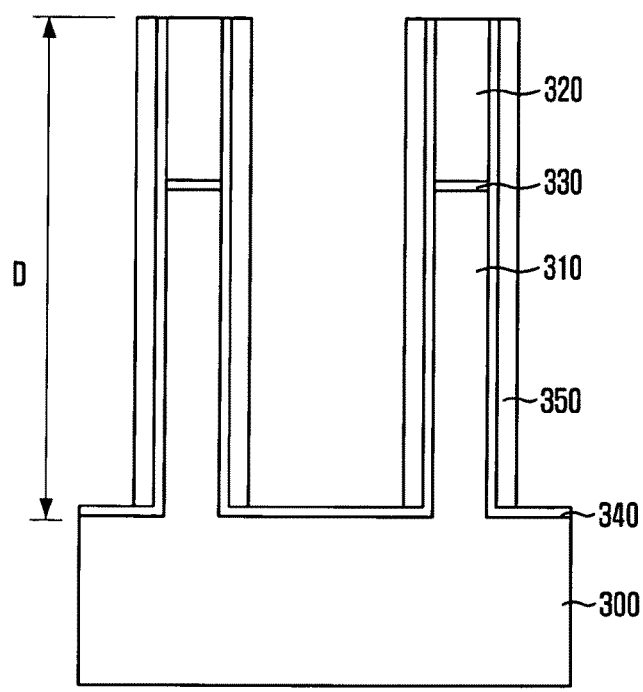

As shown in FIG. 3B, a surrounding gate electrode conduction layer 350 is formed surrounding the sidewalls of the pillar pattern on the exterior of the gate insulation layer 340. Hereinafter, a method for forming the surrounding gate electrode conduction layer 350 will be described in detail.

A conduction layer for a gate electrode is formed surrounding the resultant pillar pattern structure on the exterior of the gate insulation layer 340. The conduction layer is deposited to a predetermined thickness leaving the center of the gap region between neighboring pillar patterns opened, and the conduction layer includes a material selected form a group consisting of polysilicon, TiN, W, WSix, TaN, CoSix, NiSix and NiCox.

The conduction layer formed at bottom of the gap region between the pillar patterns 310 and the conduction layer formed on the hard mask patterns 320 are removed by a spacer etching a portion of the conduction layer until the gate insulation layer 340 located in the gap region between the pillar patterns 310 is exposed.

Thus, the conduction layer formed at bottom of the gap region between the pillar patterns 310 can be removed with minimally damaging the surrounding gate electrode conduction layer surrounding the sidewalls of the pillar pattern 310.

Figure 3C:
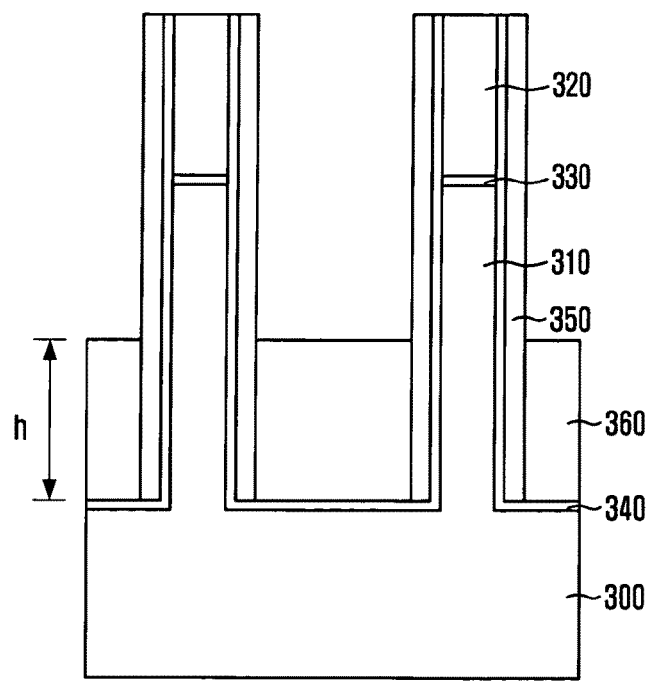

As shown in FIG. 3C, a sacrificial layer 360 fills the gap region between the pillar patterns 310 to a predetermined height h of a surrounding gate electrode. The filling process of the sacrificial layer 360 will be described in detail.

The sacrificial layer is deposited over the resultant pillar pattern structure having the surrounding gate electrode conduction layer 350. The sacrificial layer is formed of a material having an excellent gap fill characteristic, for example, Spin On Dielectric (SOD), or more preferably Spin On Carbon (SOC).

Since the SOC has a good gap fill characteristic, the SOC can completely fill the gap region between neighboring pillars 310. The SOC also has a good planarization characteristic, and therefore, may be easily removed by a plasma strip process. Therefore, the SOC is formed coating the exterior of the resultant pillar pattern structure and the surrounding gate electrode conduction layer 350, and completely fills the gap region between neighboring pillar patterns 310. The SOC can then be planarized in a gap region and a peripheral region by a planarization process.

An etch-back process is performed on the sacrificial layer in order to form the remaining portion of the sacrificial layer 360 to the predetermined height of the surrounding gate electrode. The etch-back process controls the height of the surrounding gate electrode and the channel formed between the electrodes of each pillar pattern. For example, pillar pattern 310 is formed to a height of approximately 2000 Å, the predetermined height of the surrounding gate electrode, i.e., the height of the channel, ranges from approximately 500 Å to approximately 1500 Å.

As describe above, when the sacrificial layer 360 is formed using the SOC having a good planarization characteristic, the channel height of the pillars 310 can be controlled uniformly by using the etch-back process. By using $N_2$ plasma gas and $O_2$ plasma gas for the etch-back process, damage to the hard mask patterns 320 can be minimized.

Figure 3D:
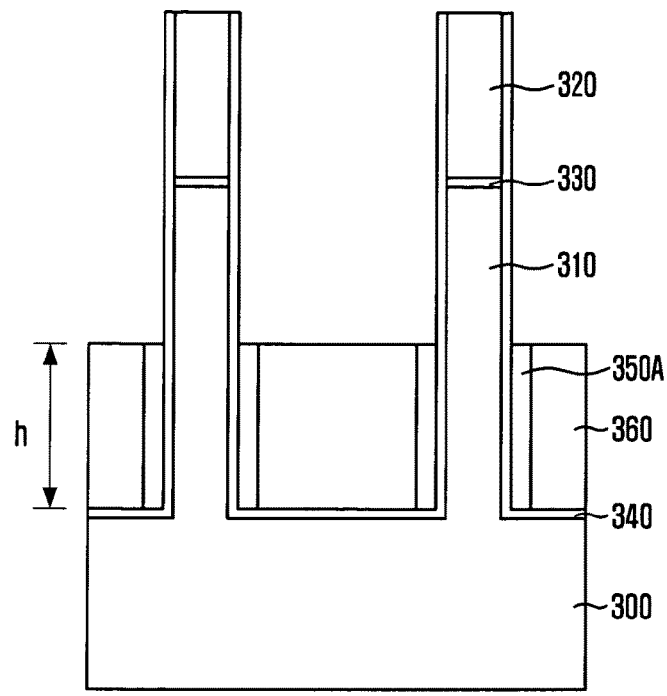

As shown in FIG. 3D, a surrounding gate electrode 350A surrounding the lower sidewalls of the pillar pattern 310 is formed by removing the exposed surrounding gate electrode conduction layer 350 by using the remaining sacrificial layer 360.

In order to minimize damage to the hard mask patterns 320, the surrounding gate electrode conduction layer 350 is removed under a high etch selectivity with respect to the hard mask patterns 320 in order to minimize damage of the hard mask patterns 320. For example, a pressure is applied in a range of approximately 20 mT to approximately 60 mT; a bias power less than 50 W is applied; a source power is supplied in a range of approximately 300 W to approximately 1200 W; and a gas may be one selected from a group consisting of $BCl_3$, $Cl_2$, Ar, $O_2$ and $CF_4$.

The removal process of the surrounding gate electrode conduction layer 350 can also be performed by an isotropic etching. In this case, the surrounding gate electrode conduction layer 350 formed surrounding the sidewalls of the pillar pattern 310 can be effectively removed using the remaining sacrificial layer 360 as an etch barrier. Therefore, the height of the surrounding gate electrode and the channel height are determined based on the height of the remaining sacrificial layer 360 filled in the gap region between the neighboring pillar patterns 310. Thus, the pillar patterns 310 may have a uniform channel height.

During the etching process of the surrounding gate electrode conduction layer 350, the remaining sacrificial layer 360 filled in the gap region between the neighboring pillar patterns 310 protects the gate insulation layer 340 and the substrate 300 located at the bottom portion of the gap region between the neighboring pillar patterns 310. The gate insulation layer 340 located at the bottom portion of the gap region between the neighboring pillar patterns 310 is not exposed and the substrate 300 is protected from the damage such as a punch-though.

Figure 3E:
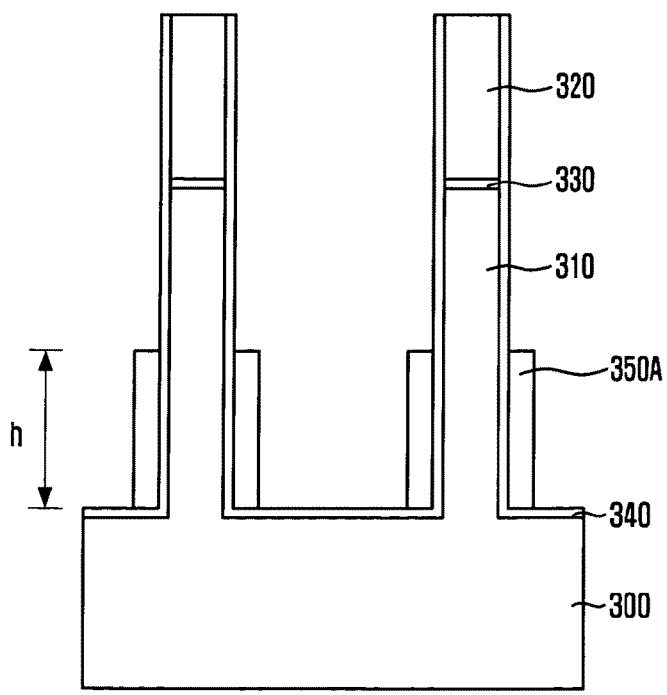

As shown in FIG. 3E, the remaining sacrificial layer 360 filled in the gap region between the neighboring pillar patterns 310 is removed. When the sacrificial layer is made of the SOC, the remaining sacrificial layer 360 may be removed by the plasma strip process.

The plasma strip process is performed by using $N_2$ plasma gas and $O_2$ plasma gas and is performed in the same chamber used for the etching process of the surrounding gate electrode conduction layer 350.

Figure 4A:
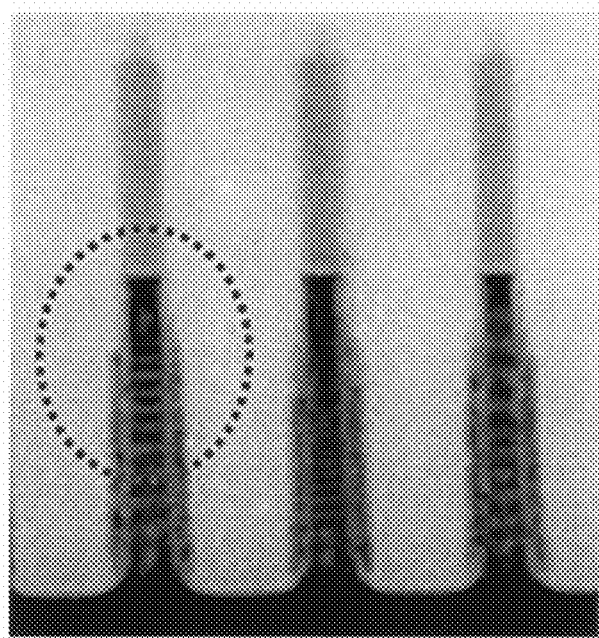
FIGS. 4A and 4B are SEM pictures showing a vertical channel transistor in accordance with an embodiment.
Figure 4B:
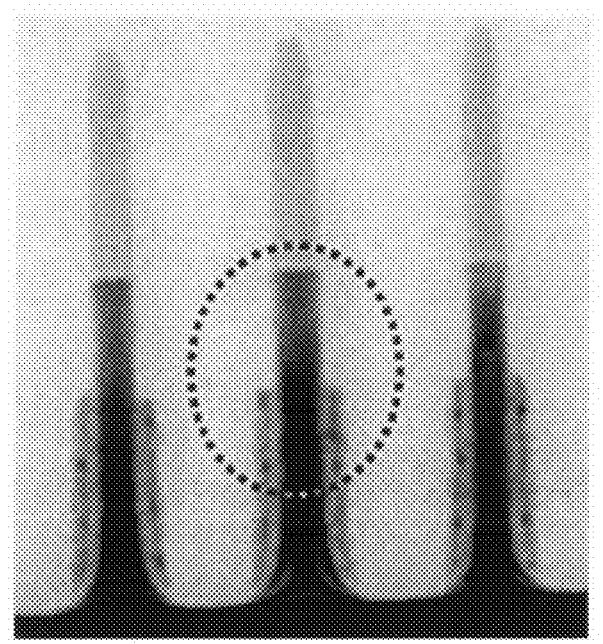

FIGS. 4A and 4B are scanning electron microscopic (SEM) pictures showing a vertical channel transistor in accordance with an embodiment. FIG. 4A presents a scanning electron micrographic picture of the vertical channel transistor when the SOC is not used as the sacrificial layer; and FIG. 4B presents a scanning electron micrographic picture of the vertical channel transistor when the SOC is used as the sacrificial layer.

As shown in FIGS. 4A and 4B, structure stability of the pillar can be improved by forming a bar-type pillar pattern having a substantially uniform width from the upper region to the lower region. Accordingly, leaning and collapse of the pillar pattern can be prevented, and the degree of integration of the semiconductor device can be improved.

As shown in FIG. 4B, a plurality of pillar patterns may have surrounding gate electrodes having a uniform profile by filling the gap region between the neighboring pillar patterns with the SOC as the sacrificial layer, and subsequently etching the surrounding gate electrode conduction layer. Furthermore, the pillar patterns may have substantially the same channel height, thus, characteristics of the semiconductor and device fabrication yield are improved.

Embodiments relate to a method for forming a surrounding gate electrode of a vertical channel transistor in a semiconductor device. According to the embodiments, since the surrounding gate electrode is formed surrounding the sidewalls of bar-type pillar patterns, leaning and collapse of the pillar pattern can be prevented and degree of integration of the semiconductor device can be improved. Also, a plurality of pillar patterns may have surrounding gate electrode with uniform profiles by filling the gap region between the neighboring pillar patterns with SOC as the sacrificial layer at the predetermined depth of the surrounding gate electrode, and subsequently etching the surrounding gate electrode conduction layer. Thus, uniformity of the channel height can be improved. Furthermore, since the sacrificial layer is made by the SOC or SOD, loss of the hard mask layer can be minimized.

While some embodiments have been described, it will be apparent to those skilled in the art that various changes and modifications may be made.

What is claimed is:

1. A method for forming a vertical channel transistor of a semiconductor device, comprising:
   forming island-type hard mask patterns over a substrate;
   forming a plurality of pillar patterns to form a resultant pillar pattern structure with gap regions between neighboring pillar patterns, by etching the substrate using the island-type hard mask patterns as etch barriers;
   forming a gate insulation layer encapsulating the resultant pillar pattern structure;
   forming a surrounding gate electrode conduction layer surrounding only the sidewalls of the pillar patterns including the gate insulation layer, the surrounding gate electrode conduction layer not covering the gate insulation layer formed on a bottom of the gap regions between neighboring pillar patterns;
   filling a sacrificial layer to a predetermined height of a surrounding gate electrode in the gap regions between neighboring pillar patterns having the surrounding gate electrode conduction layer; and
   forming a surrounding gate electrode by removing a portion of the surrounding gate electrode conduction layer exposed by the sacrificial layer.

2. The method of claim 1, wherein an upper region and a lower region of the pillar patterns have a substantially uniform width and the pillar patterns have a cylindrical shape.

3. The method of claim 1, wherein the sacrificial layer includes a material having a good gap-fill characteristic to fill the gap regions between neighboring pillar patterns completely.

4. The method of claim 3, wherein the sacrificial layer includes a Spin On Carbon (SOC) or a Spin On Dielectric (SOD).

5. The method of claim 1, wherein forming the surrounding gate electrode conduction layer comprises:
   depositing a conduction layer surrounding the resultant pillar pattern structure having the gate insulation layer; and
   removing a portion of the conduction layer until the gate insulation layer located at the bottom of the gap regions is exposed, to form the surrounding gate electrode conduction layer.

6. The method of claim 5, wherein removing a portion of the conduction layer is performed by using a spacer etching.

7. The method of claim 1, wherein filling the sacrificial layer to the predetermined height comprises:
   depositing a sacrificial layer material surrounding the resultant pillar pattern structure having the surrounding gate electrode conduction layer; and
   performing an etch-back process on the sacrificial layer material to thereby form the sacrificial layer to the predetermined height in the gap regions between neighboring pillar patterns.

8. The method of claim 7, wherein the sacrificial layer comprises SOC.

9. The method of claim 8, wherein performing etch-back process on the sacrificial layer material comprises performing a plasma strip using $N_2$ plasma gas and $O_2$ plasma gas.

10. The method of claim 1, wherein forming the surrounding gate electrode by removing the portion of the surrounding gate electrode conduction layer is performed under a high etch selectivity of the surrounding gate electrode conduction layer with respect to the hard mask patterns.

11. The method of claim 10, wherein the surrounding gate electrode conduction layer is removed by using an isotropic etching.

12. The method of claim 1, further comprising:
   removing the sacrificial layer filled in the gap regions between neighboring pillar patterns after forming the surrounding gate electrode by removing the portion of the surrounding gate electrode conduction layer.

13. The method of claim 12, wherein the sacrificial layer comprises SOC.

14. The method of claim 13, wherein removing the sacrificial layer is performed by using a plasma strip.

15. The method of claim 14, wherein the plasma strip is performed by using $N_2$ plasma gas and $O_2$ plasma gas.

16. A method for forming a semiconductor device, comprising:
   forming an island-type hard mask pattern over a substrate;

forming a pillar pattern with a gap region between the pillar pattern and neighboring pillar patterns by etching the substrate using the island-type hard mask pattern as an etch barrier;

forming a gate insulation layer encapsulating the pillar pattern;

forming a surrounding gate electrode conduction layer surrounding only sidewalls of the pillar pattern including the gate insulation layer, the surrounding gate electrode conduction layer not covering the gate insulation layer formed on a bottom of the gap region;

covering the surrounding gate electrode conduction layer with a sacrificial layer to a predetermined height; and forming a surrounding gate electrode by removing a portion of the surrounding gate electrode conduction layer exposed by the sacrificial layer.

17. The method of claim 16, wherein an upper region and a lower region of the pillar pattern have a substantially uniform width.

* * * * *